United States Patent [19]

Hakoopian

[11] Patent Number: 4,544,981
[45] Date of Patent: Oct. 1, 1985

[54] SHORT CIRCUIT PROTECTOR/CONTROLLER CIRCUIT

[75] Inventor: Hakop M. Hakoopian, Huntington, N.Y.

[73] Assignee: Harris Corporation, Melbourne, Fla.

[21] Appl. No.: 656,510

[22] Filed: Oct. 1, 1984

[51] Int. Cl.$^4$ .............................................. H02H 3/08
[52] U.S. Cl. .................................. 361/93; 330/207 P; 330/298; 361/89; 361/86
[58] Field of Search ....................... 361/86, 75, 91, 87, 361/78, 89, 93, 98, 101; 330/207 P, 298

[56] References Cited

U.S. PATENT DOCUMENTS

| | | |
|---|---|---|
| 3,102,241 | 8/1963 | Johnstone . |
| 3,369,154 | 2/1968 | Swain . |
| 3,491,264 | 1/1970 | Peterson et al. . |
| 3,495,181 | 2/1970 | Reiffin . |
| 3,500,218 | 3/1970 | Burwen . |
| 3,526,846 | 9/1970 | Campbell . |
| 3,555,358 | 1/1971 | Gibbs . |
| 3,725,739 | 4/1973 | Griffey . |
| 3,979,645 | 9/1976 | Wittenzellner . |
| 3,982,158 | 9/1976 | Knauer . |
| 3,987,342 | 10/1976 | Bird et al. . |
| 4,227,227 | 9/1980 | Yamaguchi . |
| 4,287,390 | 9/1981 | Fukaya et al. . |
| 4,302,791 | 11/1981 | Buchanan et al. .............. 361/86 |
| 4,339,802 | 7/1982 | Yamaura et al. . |
| 4,344,101 | 8/1982 | Oishi et al. . |

Primary Examiner—Reinhard J. Eisenzopf
Attorney, Agent, or Firm—Scully, Scott, Murphy & Presser

[57] ABSTRACT

A general purpose, short circuit protector/controller circuit for drivers and amplifiers which is external to the internal circuit of the driver amplifier, which is arranged to drive a load such as electronic instrumentation. In this circuit, current sensing resistors are placed in both the positive and negative power supply input lines to the amplifier, and the voltage across each of the current sensing resistors is monitored independently for an overload condition. The voltage across each current sensing resistor is proportional to the current therethrough which drives the load, and is compared to a reference voltage, which is an equivalent representation of an overload or short circuit limit. When the sensed voltage across either resistor is greater than the reference voltage, the amplifier is tri-stated (disconnected from the load). In the preferred embodiment the amplifier is tri-stated for a period $T_{OFF}$, protecting the amplifier, and is subsequently reconnected to the load for a period $T_{ON}$. If the current limit violation persists, the above cycle is repeated.

9 Claims, 2 Drawing Figures

SHORT CIRCUIT PROTECTOR/CONTROLLER CIRCUIT

BACKGROUND OF THE INVENTION

1. Field of the Invention

The present invention relates generally to a versatile short circuit protector/controller circuit for drivers and amplifiers, and more particularly pertains to a circuit of the aforementioned type which is extremely versatile in terms of its applicability to different drivers and amplifiers, which has minimal power drain, and which is capable of operation either alone or in an interface with an associated processor, such as a microprocessor.

2. Discussion of the Prior Art

Amplifiers are used extensively in the electronics industry, particularly in instrumentation and automatic test equipment where they form an essential functional block of an overall system. Moreover, it is well known in the art to provide the amplifiers with associated short circuit protection circuits for the protection of the amplifiers, and many of these short circuit protection circuits are designed and constructed integrally with the amplifier in a single integrated circuit or on a single board, which often results in restricted design deficiencies thereof. In order to improve the performance and reliability of the system, while providing testability features and reducing system costs, the design deficiencies of many known prior art short circuit protection circuits should be remedied.

Prior art techniques for protecting amplifiers which are designed and constructed internal to the device generally have associated therewith the following design deficiencies: dissipation of large power under a short circuit condition; requirement for a large heat sink to dissipate excessive heat, which occupies an appreciable usable circuit area; inability to notify a host processor of a short circuit condition when the amplifier is used in a system with processing capability; the short circuit current limit is fixed and can only be changed by redesigning the amplifier (in these systems, the sensing of the current and the processing of the signal is accomplished internal to the amplifier and accordingly critical circuit parameters cannot be changed); because of the continuous generation of heat under short circuit conditions (due to excessive power drain), the temperatures of the junctions within the device increase substantially and adversely affect the operation of the device, even after the short circuit has been identified and rectified; under a short circuit condition, the large current drawn from the power supply generates excessive heat within the system, creating associated cooling problems, and finally, a more costly power supply must be provided for the larger current capability.

SUMMARY OF THE INVENTION

Accordingly, it is a primary object of the present invention to provide a versatile short circuit protector/controller circuit for drivers and amplifiers which is extremely versatile in terms of the applicability to different drivers and amplifiers and which is capable of operation either alone or in an interface with an associated host processor.

Further objects of the subject invention are the provision of a versatile short circuit protector circuit as described which operates with minimal power drain, which does not increase the output impedance of the drivers and amplifiers or adversely affect their slew rate or the power bandwith product thereof, or degrade their performance in any respect.

More detailed objects of the present invention are to provide a design for a universal short circuit protector/controller for amplifiers and drivers with the following characteristics under short circuit conditions: protects the driven amplifier from failure; provides a settable short circuit current limit; dissipates minimal power; is not responsive to transient current spikes greater than the set current limit or system noise; eliminates degradation of the amplifier output stage drive and of the device junction within the amplifier; is capable of indicating a short circuit condition to an associated host processor; is tri-state controllable (disconnects the amplifier from the load); is a self sufficient design with no special power supply requirements; is capable of operation over a large dynamic range of input signal levels (e.g. 0 to ±30V); and has a cascadable interrupt capability.

In accordance with the teachings herein, the present invention provides a general purpose, short circuit protector/controller circuit for drivers and amplifiers. The protector/controller circuit is external to the internal circuit of the driver amplifier, which is arranged to drive a load such as electronic instrumentation. In this circuit, current sensing resistors are placed in both the positive and negative power supply input lines to the amplifier, and the voltage across each of the current sensing resistors is monitored independently for an overload condition. In this arrangement, the voltage across each current sensing resistor is proportional to the current therethrough which drives the load. These voltages are compared to a reference voltage, which is an equivalent representation of an overload or short circuit limit. When the sensed voltage across either resistor is greater than the reference voltage, the amplifier is tri-stated (disconnected from the load). This arrangement is advantageous as the current sensing resistors are not placed in the emitters of the output stage transistors of an amplifier, similar to many prior art arrangements, which would increase the output impedance thereof and adversely affect the slew rate and the power bandwidth product of the device. By sensing the current in the positive and negative power supply lines of the amplifier, both polarities of current violations are detected and the performance of the amplifiers is not degraded as described above.

In greater detail, in the preferred embodiment the amplifier is tri-stated for a period $T_{OFF}$, protecting the amplifier, and is subsequently reconnected to the load for a period $T_{ON}$. If the current limit violation persists, the above cycle is repeated. If the current limit violation ceases, the cycle is terminated at the end of $T_{OFF}$ period, when normal operation is resumed. The circuit can also be operated such that the amplifier is tri-stated until manually set for normal operation.

BRIEF DESCRIPTION OF THE DRAWINGS

The foregoing objects and advantages of the present invention for a short circuit protector and controller circuit may be more readily understood by one skilled in the art with reference being had to the following detailed description of a preferred embodiment thereof, taken in conjunction with the accompanying drawings wherein like elements are designated by identical reference numerals throughout, and in which.

DETAILED DESCRIPTION OF THE DRAWINGS

Figure 1:
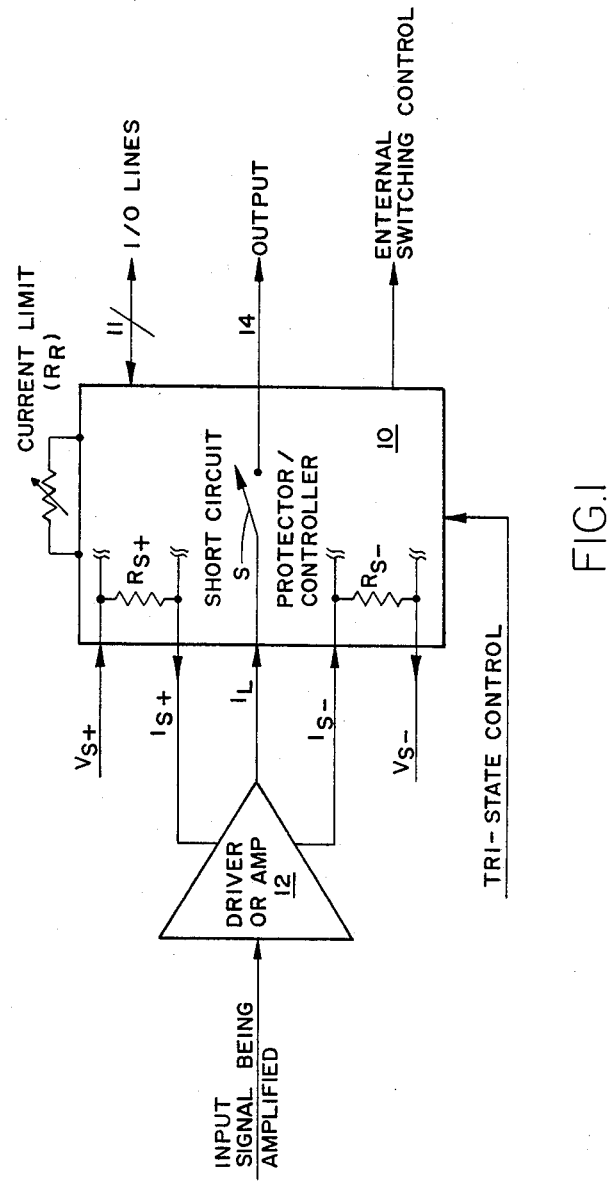
FIG. 1 is a block diagram showing the connection of a short circuit protector/controller circuit constructed pursuant to the teachings of the present invention, connected between the power supply lines and a power amplifier and its output.

FIG. 1 is a block diagram showing the short circuit protector/controller circuit 10 of the present invention connected between the power supply lines and a driver amplifier 12 and its output 14. A positive power supply $V_{S+}$ is introduced into the short circuit protector/controller 10 of the present invention, and a current $I_{S+}$ flows through a first current sensing resistor $R_{S+}$ therein to the driver amplifier 12. Likewise, a current $I_{S-}$ flows from the driver amplifier 12 to the short circuit protector/controller circuit 10, through a current sensing resistor $R_{S-}$ therein to the negative power supply $V_{S-}$. In the event either current $I_{S+}$ or $I_{S-}$ exceeds a given threshold, a switch S is opened to tri-state the amplifier 12. An alert can then be signalled through an LED display, or an associated host processor can be interrupted, as by a hard wired interrupt.

The voltage developed across current sensing resistors $R_{S+}$ and $R_{S-}$ are compared in circuit 10 with a reference voltage, which is an equivalent representation of a required current limit. When the sensed voltage across a current sensing resistor is greater than the reference voltage, the amplifier is tri-stated for a period $T_{OFF}$, protecting the amplifier, and the amplifier is subsequently reconnected to the load for a period $T_{ON}$. If the current limit violation persists, the above cycle is repeated.

The following power calculation and analysis under a short circuit condition is applicable to this type of operation.

$I_{S-}$ = Stand-by current drawn by the amplifier from the negative line of the power supply.
$I_{S+}$ = Stand-by current drawn by the amplifier from the positive line of the power supply.
$I_L$ = Load current.
$I_C$ = Set current limit.
$V_-$ = Negative power supply voltage.
$V_+$ = Positive power supply voltage.
$V = V_- = V_+$
$T_{ON}$ = The time the amplifier is connected to the load.
$T_{OFF}$ = The time the amplifier is tri-stated (disconnected from the load).
$I_{LK}$ = Leakage current to the load when the amplifier is tri-stated.

Stand-by power ($P_s$) dissipated by the amplifier.
$P_S = V(I_{S-} + I_{S+})$
Power ($P_T$) dissipated by the amplifier, under short circuit conditions, for a period of $T_{ON}$.

$$P_T = P_S + I_L \times V \quad (1)$$

Power ($P_T$) dissipated by the amplifier, when the amplifier is tri-stated, for a period $T_{OFF}$.

$$P_T = P_S + I_{LK} \times V \quad (2)$$

Total average power ($P_{TA}$) dissipated by the amplifier for the cycle ($T_{ON} + T_{OFF}$).

$$P_{TA} = \frac{(P_S + I_L \times V)T_{ON} + (P_S + I_{LK} \times V)T_{OFF}}{(T_{ON} + T_{OFF})} \quad (3)$$

$$= \frac{P_S(T_{ON} + T_{OFF}) + I_L V \times T_{ON} + I_{LK} V \times T_{OFF}}{(T_{ON} + T_{OFF})}$$

$$P_{TA} = \frac{P_S + I_L \times V \times T_{ON} + I_{LK} \times V \times T_{OFF}}{(T_{ON} + T_{OFF})} \quad (4)$$

Since $I_{LK}$ is extremely small, compared to $I_L$, in the uA range, and $T_{OFF}$ is $<0.1$sec., $I_{LK} \times V \times T_{OFF} \approx 0$. Substituting values in equation (4), $$P_{TS} = P_S + I_L \times V \times \left(\frac{T_{ON}}{T_{ON} + T_{OFF}}\right) \quad (5)$$

$$P_{TA} = P_S + I_L \times V \times \left(\frac{1}{1 + \frac{T_{OFF}}{T_{ON}}}\right)$$

For $\frac{T_{OFF}}{T_{ON}} >> 1$ $$1 + \left(\frac{T_{OFF}}{T_{ON}}\right) \approx \left(\frac{T_{OFF}}{T_{ON}}\right)$$

Substituting values in equation (5), $$P_{TA} = P_S + I_L \times V \times \left(\frac{T_{ON}}{T_{OFF}}\right) \quad (6)$$

Since $(T_{OFF}) >> 1, \left(\frac{T_{ON}}{T_{OFF}}\right) \approx 0$

Practical value off $$\left(\frac{T_{OFF}}{T_{ON}}\right) > 1000$$

Substituting values in equation (6).

$$P_{TA} = P_S$$

Hence, the power dissipated in the amplifier under a short circuit condition is the standby power, which represents minimal power dissipation.

The following calculation of the current set limit ($I_C$) under short circuit conditions is also presented.

$R_S$ = Current sensing resistor.
Voltage across sensing resistor.
$V_{RS} = R_S(I_S + I_L)$
$V_{RS} = R_S \times I_C$ Hence, the reference voltage ($V_{RS}$), which is the equivalent representation of the current limit, must only account for the standby current.

Figure 2:
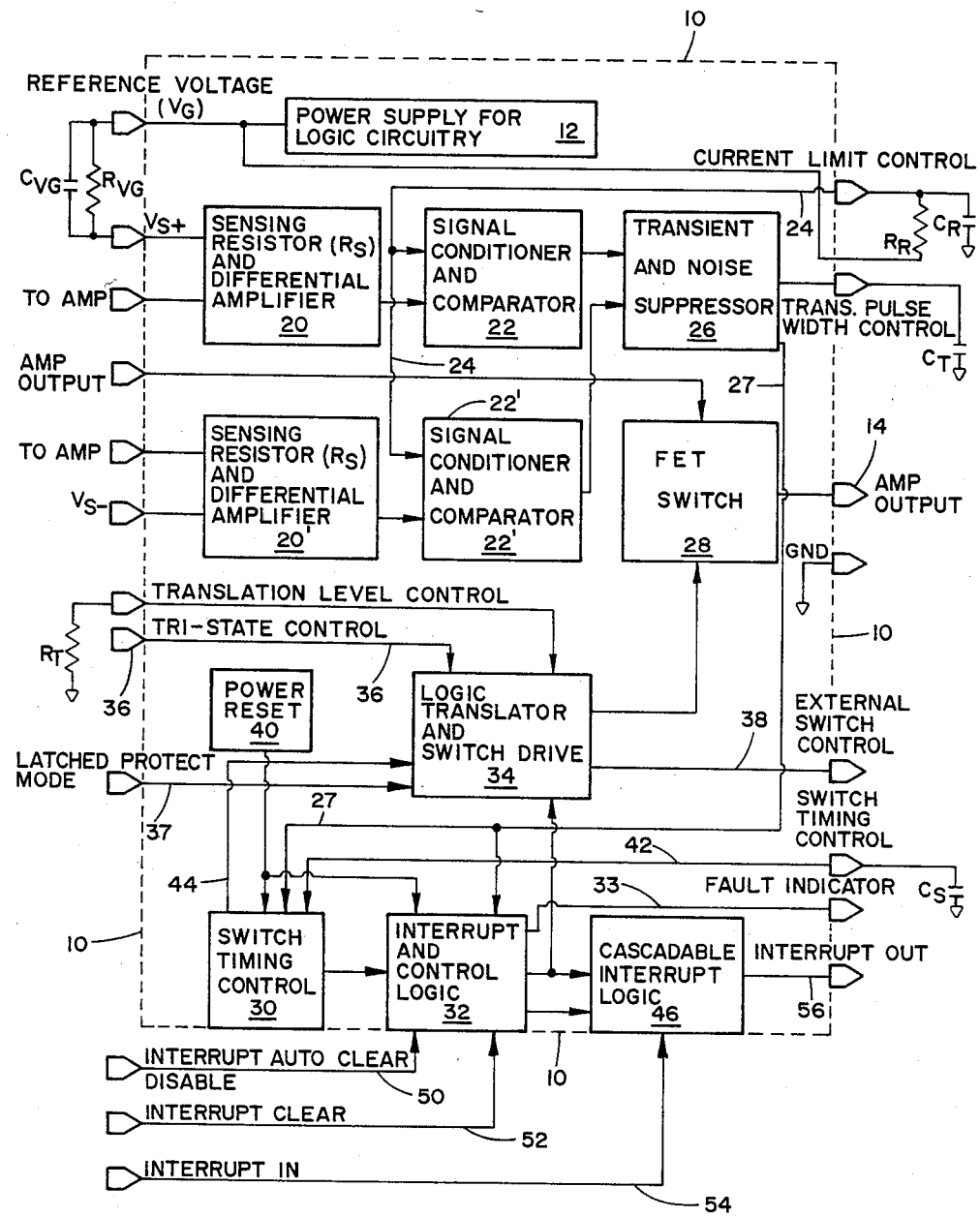
FIG. 2 illustrates a block diagram of a preferred embodiment of the short circuit protector/controller circuit of the present invention, illustrating the major components thereof.

FIG. 2 illustrates a block diagram of a preferred embodiment of a short circuit protector/controller circuit 10 pursuant to the present invention. In a preferred embodiment, all of the components within the dashed line of circuit 10 are preferably constructed in a single IC. A power supply 12 develop the reference voltage $V_G$, which is used for both the reference voltage and the power supply for the internal logic circuits. The values of an external capacitor $C_{VG}$ and an external resistor $R_{VG}$ are selected in dependence upon the voltage supply requirements of the particular driver amplifier 12, to develop the positive voltage supply $V_{S+}$ therefor.

The voltage across the sensing resistor $R_{S+}$ is amplified by a differential amplifier in circuit 20, and applied as an input to a signal conditioner and comparator circuit 22 where it is compared in a comparator circuit with a threshold voltage supplied on line 24, developed from $V_G$ by an externally connected resistor $R_R$ and an externally connected capacitor $C_R$. The value of $R_R$ determines the threshold current limit for the amplifier 12, while capacitor $C_R$ is provided to filter out noise. The threshold comparison circuit 22 can also provide filtering and conditioning of the processed signals in dependence upon the nature of the signals, which in different applications can range from DC signals to high frequency signals of many $MH_3$. High frequency signals could be processed in circuit 22 to obtain their RMS values, or alternatively only the peaks of the signals might be examined, depending upon the nature of the application. The output of threshold comparison circuit 22 is directed to a transient pulse width control circuit 26, coupled to an external capacitor $C_T$, the selected value of which determines the suppression width of transient or noise currents exceeding the threshold current, which are essentially disregarded by circuit 26 when their widths do not exceed the width determined by capacitor $C_T$.

The voltage across the sensing resistor $R_{S-}$ is processed in a similar manner to the voltage across the sensing resistor $R_{S+}$, in a parallel channel 20', 22', and either channel can independently generate an output pulse of sufficient width to trigger the pulse width control circuit 26, which in turn opens a switch S, preferably in the form of an FET switch 28, which disconnects the output of driver amplifier 12 from its associated load on output line 14. This independent monitoring of both the positive supply current $I_{S+}$ and the negative supply current $I_{S-}$ is advantageous since the current sensing resistors are not placed in the emitters of the output stage transistors of an amplifier, which would increase the output impedance thereof and adversely affect the slew rate and the power bandwith product of the device. By sensing the current in the positive and negative power supply lines of the amplifier, both polarities of current violations are detected and the performance of the amplifier is not degraded as described above.

Since the supply fluctuations to the amplifier are very small (equal to $R_S(I_S+I_L)$) and the power supply rejection ratio of amplifiers are generally very high, very large portions of the fluctuations are eliminated and will not appear at the output. The extremely high frequency components of the supply line fluctuations are usually bypassed by filter capacitors at the supply rails to the amplifier.

The short circuit protector controller circuit 10 provides for additional versatile processing and additional versatile interfacing with an associated host processor as follows. The pulse width control circuit 26 actuates the FET switch 28 through a switch timing control circuit 30 and a logic translator and switch drive circuit 34. The pulse width control circuit 26, upon detection of an overload current, generates an enabling output signal on line 27 to enable the timing control circuit 30, which is responsive thereto to generate $T_{ON}$ pulses separated by $T_{OFF}$ periods, as described above. The designs of suitable pulse generating circuits using monostable multivibrators are well known in the art, and accordingly will not be disclosed in detail herein. An externally connected timing control capacitor $C_S$ is provided to allow its selection to control the timing ratio of the $T_{ON}/T_{OFF}$ periods.

The switch timing control circuit 30 also includes a power reset input 40 to prevent switching during a power reset, as when the power is first turned on or a short power interruption has occurred. The power reset circuit produces a negative going clear pulse of sufficient width to initialize the controller circuit 10 to a defined initial state. The controller circuit 10 is automatically switched to a Continuously Monitored Protect Mode with Automatic Interrupt Clear, as described hereinbelow.

In a Continuously Monitored Protect mode of operation, upon the detection of a current violation, the FET switch 28 is turned off (opened) for a period of time $T_{OFF}$, isolating the amplifier and protecting it. The switch is then turned on for a period of time $T_{ON}$, and the sensed voltage monitored. If the current limit violation persists, the switch is turned off (opened) again for the period of time $T_{OFF}$. The above cycle is continuously repeated until the current limit violation ceases when normal operation resumes at the completion of the time period $T_{OFF}$.

In this Continuously Monitored Protect mode, the interrupt can be processed in two further modes as described hereinbelow. In a first Automatic Interrupt Clear mode, on power up, the interrupt is cleared when the current violation ceases. In this mode a host processor must process the interrupt during a short circuit condition. In a second Interrupt Auto Clear Disable mode, the automatic interrupt clear is disabled by issuing a positive edge Transistor Transistor Logic (TTL) signal, the Interrupt Auto Clear Disable on line 50. The interrupt can be processed at any time after the detection of a current violation. After processing of the interrupt, the processor clears the interrupt by issuing a negative going TTL pulse, the Interrupt Clear on line 52.

A Latched Protect Mode input on line 37 is also provided to enable protection of the amplifier without on and off cycling of the FET switch when a current violation is detected. In this mode, upon detection of a current violation, after FET switch 12 is turned off (opened), isolating the amplifier from the load and protecting it, the host processor disables the interrupt auto clear by clocking a positive edge, the Interrupt Auto Clear Disable on line 50. After processing the interrupt, the processor then clears the interrupt by issuing a negative going pulse, the Interrupt Clear on line 52.

In a preferred embodiment, the timing control circuit 30 provides the $T_{ON}$ pulses at a TTL (Transistor Transistor Logic) level, which is not ordinarily compatible with the drive requirements of the FET switch 28, which in a preferred embodiment is selected to provide for switching over a full dynamic maximum range of ±30 volts. Accordingly, the logic translator and switch drive circuit 34 is provided to convert from the TTL logic levels on line 44 to suitable drive signals for the FET switch 28. An external resistor $R_T$ is provided to select an appropriate logic translation output level for drive circuit 34, depending upon the drive requirements of the FET switch 28.

The switch drive circuit 34 is also controllable by two other inputs. An external Tri-State control input signal on line 36, which can be a TTL level positive strobe signal, can also independently deactivate the switch drive circuit 34, opening FET switch 28 and disconnecting the amplifier load during its presence. An external switching output 38 from the drive circuit 34 can also provide a TTL equivalent of the switch drive signal, and can be used to control an associated external switch or circuit rather than internal FET switch 38, either in response to a detected current overload violation by circuit 26, or by the command of an associated host processor.

Circuits are also provided to allow versatile operation of the short circuit protector/controller circuit 10, either alone or in interfacing with a host processor. The interrupt and control logic circuit 32 provides for a convenient interface between the controller circuit 10 and an associated processor.

The interrupt and control logic circuit 32 also provides an output of a low level fault indicator signal on line 33, which indicates a current violation status of the amplifier, and this signal can be utilized, for instance, to drive an LED display.

One possible embodiment of the interrupt and control logic circuit 32 can include flip flops and combinatorial logic. In this embodiment, an Interrupt Auto Clear Disable input on line 50 clocks a controlling flip flop, the output of which disables the automatic clearing of an interrupt flip flop by the switch timing and control logic circuit 30. The Interrupt Clear input on line 52 clears both the controlling flip flop, as described above, and the interrupt flip flop to the initial state.

An Interrupt In input on line 54 is routed through the combinatorial logic, which is controlled by the controlling flip flop, to the Interrupt Out line 56. When the Interrupt Auto Clear Disable input is issued on line 50, the Interrupt In line 54 is disabled from reaching the Interrupt Out line 56. When the Interrupt Clear is issued on line 52, the Interrupt In on line 54 is routed out to the Interrupt Out line 56, enabling processing of an enternal interrupt generated by an external chained device, as described hereinbelow, or another alternative device.

When the circuit of FIG. 2 is one stage of multiple similar stages, a cascadable interrupt logic circuit 46 can be implemented which can receive an Interrupt In signal from a previous stage, and can direct an Interrupt Out signal to the subsequent stage, or to a processor, indicating the current violation status of the amplifier. In this arrangement, interrupts from a number of these stages can be chained such that a single hard wire interrupt to the processor can service all of the various interrupts simultaneously from the several stages. In this manner, an external TTL logic one level interrupt from a previous stage can be cascaded through this input. The external interrupt can be masked by issuing a TTL positive edge signal, the Interrupt Auto Clear Disable input on line 50. After processing the Interrupt Out, generated by circuit 10 on line 56, the external interrupt can be processed next by issuing an Interrupt Clear signal on line 52, which clears the interrupt generated by circuit 10 and enables an external Interrupt In to be routed to the processor through the Interrupt Out line 56.

While a preferred embodiment and several variations of the present invention for a short circuit protector/controller circuit are described in detail herein, it should be apparent that the disclosure and teachings of the present invention will suggest many alternative designs to those skilled in the art.

What is claimed is:

1. A short circuit protector/controller circuit for an amplifier driving an electrical load, with the protector/controller circuit being external to the internal circuit of the amplifier, comprising:
   a. a positive voltage supply for the amplifier, coupled through a positive current sensing resistor placed in series with the positive power supply input line to the amplifier, such that the voltage across the positive current sensing resistor can be monitored independently for an overload condition;
   b. a negative voltage supply for the amplifier, coupled through a negative current sensing resistor placed in series with the negative power supply input line to the amplifier, such that the voltage across the negative current sensing resistor can be monitored independently for an overload condition;
   c. first means for comparing the voltage across said positive current sensing resistor with a reference threshold voltage which represents an overload circuit condition;
   d. second means for comparing the voltage across said negative current sensing resistor with a reference threshold voltage which represents an overload circuit condition; and
   e. means, responsive to the outputs of said first and second comparing means, for disconnecting the amplifier from its electrical load when the voltage across either of the positive or negative current supply resistors exceeds its reference threshold voltage.

2. A short circuit protector/controller circuit for an amplifier as claimed in claim 1, said means for disconnecting including an electrical switch placed between the amplifier and its electrical load.

3. A short circuit protector/controller circuit for an amplifier as claimed in claim 2, said electrical switch comprising a FET switch.

4. A short circuit protector/controller circuit for an amplifier as claimed in claim 1, further comprising a transient and noise suppressor circuit means, coupled to the outputs of said first and second comparing means, for passing an overload signal only when the voltage across either of the positive or negative current sensing resistors exceeds its reference threshold voltage for a given time duration.

5. A short circuit protector/controller circuit for an amplifier as claimed in claim 1, further comprising a switch timing control circuit means, responsive to the detection of an overload circuit condition by either of said first or second comparing means, for controlling said disconnecting means and generating periodic $T_{ON}$ pulses followed by periodic $T_{OFF}$ periods.

6. A short circuit protector/controller circuit for an amplifier as claimed in claim 1, further comprising an interrupt and control logic circuit means for providing an interface with an associated processor, and having an interrupt auto clear disable input and an interrupt clear input.

7. A short circuit protector/controller circuit for an amplifier as claimed in claim 6, further comprising a cascadable interrupt logic circuit means for providing cascading of multiple stages of amplification, each having said short circuit protector/controller circuit.

8. A short circuit protector/controller circuit for an amplifier as claimed in claim 1, further comprising a logic translator and switch drive means for converting from a first level of logic signals to a second level of logic signals suitable to drive said disconnecting means.

9. A short circuit protector/controller circuit for an amplifier driving an electrical load, with the protector/controller circuit being external to the internal circuit of the amplifier, comprising:
   a. a positive voltage supply for the amplifier, in series with the positive current sensing resistor placed in series with the positive power supply input line to the amplifier, such that the voltage across the positive current sensing resistor can be monitored independently for an overload condition;
   b. a negative voltage supply for the amplifier, coupled through a negative current sensing resistor placed in amplifier, such that the voltage across the negative current sensing resistor can be monitored independently for an overload condition;
   c. first means for comparing the voltage across said positive current sensing resistor with a reference threshold voltage which represents an overload circuit condition;
   d. second means for comparing the voltage across said negative current sensing resistor with a reference threshold voltage which represents an overload circuit condition;
   e. a transient and noise suppressor circuit means, coupled to the outputs of said first and second comparing means, for passing an overload signal only when the voltage across either of the positive or negative current sensing resistors exceeds its reference threshold voltage for a given time duration;
   f. a switch timing control circuit means, responsive to said overload signal, for generating periodic $T_{ON}$ pulses followed by periodic $T_{OFF}$ periods:
   g. An FET switch means, responsive to said $T_{ON}$ signals for connecting the amplifier to its electrical load, and for disconnecting the amplifier from its electrical load during said $T_{OFF}$ periods;
   h. a logic translator and switch drive means for converting from a first level of logic signals produced by said switch timing control circuit means to a second level of logic signals suitable to drive said FET switch means;
   i. an interrupt and control logic circuit means for providing an interface with an associated processor, and having an interrupt auto clear disable input and an interrupt clear input; and
   j. a cascadable interrupt logic circuit means for providing cascading of multiple stages of amplification, each having a short circuit protector/controller circuit.

* * * * *